US007929320B2

(12) United States Patent
Mashino

(10) Patent No.: US 7,929,320 B2
(45) Date of Patent: Apr. 19, 2011

(54) INDUCTOR BUILT-IN WIRING BOARD HAVING SHIELD FUNCTION

(75) Inventor: Naohiro Mashino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 386 days.

(21) Appl. No.: 12/165,885

(22) Filed: Jul. 1, 2008

(65) Prior Publication Data

US 2009/0008148 A1 Jan. 8, 2009

(30) Foreign Application Priority Data

Jul. 3, 2007 (JP) ................................. 2007-175514

(51) Int. Cl.
*H05K 9/00* (2006.01)

(52) U.S. Cl. ......................... 361/816; 361/800; 361/818

(58) Field of Classification Search .................. 174/350, 174/354, 363, 370, 250, 50.5, 50.51, 50.62, 174/520, 72 R, 79, 387; 361/728, 748, 760, 361/761, 763, 782, 800, 799, 803, 816, 818; 336/84 C
See application file for complete search history.

(56) References Cited

U.S. PATENT DOCUMENTS

| | | | | |
|---|---|---|---|---|
| 5,014,160 | A * | 5/1991 | McCoy, Jr. | 361/818 |
| 6,049,468 | A * | 4/2000 | Learmonth | 361/816 |
| 2005/0205292 | A1* | 9/2005 | Rogers et al. | 174/255 |
| 2007/0187136 | A1* | 8/2007 | Higashiguchi et al. | 174/250 |
| 2007/0273602 | A1* | 11/2007 | Zhu et al. | 343/841 |

FOREIGN PATENT DOCUMENTS

| | | |
|---|---|---|
| JP | 05-183274 | 7/1993 |
| JP | 2001-077538 | 3/2001 |

* cited by examiner

*Primary Examiner* — Dameon E Levi
*Assistant Examiner* — Hoa C Nguyen
(74) *Attorney, Agent, or Firm* — Rankin, Hill & Clark LLP

(57) ABSTRACT

There is provided a wiring board having a shield function. The wiring board includes: a plurality of conductive shield patterns adapted to surround a circumference of at least one electronic component mounting area on the wiring board, the plurality of conductive shield patterns being adjacent to each other; and at least one inductor formed of a conductive pattern and provided between the conductive shield patterns.

8 Claims, 9 Drawing Sheets

INDUCTOR BUILT-IN WIRING BOARD HAVING SHIELD FUNCTION

This application is based on and claims priority from Japanese Patent Application No. 2007-175514, filed on Jul. 3, 2007, the entire contents of which are hereby incorporated by reference.

BACKGROUND

1. Technical Field

The present disclosure relates to a wiring board having a shield function, and more particularly, to an inductor built-in wiring board having a shield function.

2. Related Art

In a power supply circuit used for a cellular phone, a personal computer, a portable terminal, a PDA, a vehicle control device, a small-size communication machine, a small-size game machine, and the like, inductors (switching power supply or the like) are essential components, and the inductors are separately mounted on a printed circuit board. That is, as a general method, electronic components or electronic circuit elements are mounted on the printed circuit board, and discrete coils are soldered onto the printed circuit board when components having desired circuit functions such as inductors are necessary.

FIG. 1 shows an inductor according to the related art. In FIG. 1, an inductor is formed by winding a coil 2 around a magnetic core 1 and is covered with a shield 3. The inductor is mounted on a printed circuit board (not shown) through mounting terminals 4. An electric current 5 is allowed to flow in the coil 2, thereby generating a magnetic flux 6.

According to the related-art method of mounding the components on the printed circuit board as described above, it is necessary to prepare the discrete coil, and thus management of components is complicated. In addition, there might be a problem in reliability for mounting components. Moreover, a considerable space for mounting components such as coils is necessary, and thus it is difficult to reduce a size of a device.

However, since a technique of forming a conductive pattern on a printed circuit board has been advanced, an attention is paid on a method of directly forming a coil on a printed circuit board with a conductive pattern. In the method of forming a coil on a printed circuit board with a circuit pattern, in order to obtain a desired inductance value, it is necessary to increase a size of the pattern. As a result, a size of the printed circuit board increases, and thus it is difficult to reduce the size of the device.

In order to solve such a problem, JP-A-5-183274 discloses a printed circuit board in which a coin requires no space for fixing, and whereby a desired inductance value can be obtained in a limited area on a printed circuit. Specifically, a printed circuit board formed of multi-layers includes a coil having a given wire width, wire distance, and number of windings. The coil is formed such that winding directions of adjacent spiral patterns are reverse directions to each other, and the spiral patterns are coupled by a blind via-hole, an inner via-hole, or a through-hole. As an example, a spiral pattern which is wound clockwise from a terminal part is formed on a first layer. The other end portion of the pattern of the first layer is coupled with a pattern of a second layer via a blind via-hole and the pattern is wound counterclockwise. The other end portion of the pattern of the second layer is coupled with a pattern of a third layer via a through-hole and the pattern is wound clockwise. The end portion of the pattern of the third layer is coupled with a pattern of a fourth layer via a blind via-hole and the pattern is wound counterclockwise.

When current is applied to the patterns including the first layer to the fourth layer, the same direction current flows in the pattern of each layer, and an inductance value can be obtained wherein the coil inductances of the respective layer patterns are added.

Accordingly, it is possible to form a coil having a desired inductance value on a printed circuit board. Even when a coil needs to be formed on a circuit, it is unnecessary to attach a coil component. In addition, since the coil is formed throughout the multi-layers of the printed circuit board, there is no case that the area of the board becomes excessively large.

As with JP-A-5-183274, JP-A-2001-77538 discloses a pattern coil on a printed board capable of obtaining a necessary reactance value, a capacitance value, or a resistance value on a board pattern, without mounting discrete coil components, capacitor components, or resistor components. For this reason, C-shaped patterns are formed on the surface of each layer of a build-up multilayer board, and the patterns are coupled to each other by build-up vias, so as to form a coil which is shaped into spiral as a whole. Therefore, a reactance value can be obtained in the board patters.

Since the coil is formed in the board without mounting the discrete coil components or the like, it is possible to reduce the number of components, thereby freely setting coil characteristics (reactance value).

Meanwhile, since magnetic field is generated in the wiring board by providing the wiring board with the inductor, it is necessary to provide a shield to shield and prevent various kinds of components mounted on the wiring board from the magnetic field. For this reason, each circuit block is shielded by separately providing the wiring board with a member only for shield or by providing a metal plate or a shield plate formed of a resin plate, wherein metal plating is applied to a surface of the shield plate, on a circuit board.

FIGS. 2 to 4 show one example in the related art, where a wiring board is provided with a shield plate (panel) for shielding. FIG. 2 is a plan view illustrating a circuit board having a shield pattern formed thereon. FIG. 3 is a plan view illustrating a shield plate (panel) formed of a metal plate or the like. FIG. 4 is a cross-sectional view illustrating a contact portion between a pattern protrusion portion of the shield plate and a shield pattern formed on the wiring board.

As shown in FIG. 2, various kinds of electronic components 11 such as semiconductor elements are mounted on the surface of a wiring board 10. The electronic components include board-mounted inductors 12. A conductive shield pattern 14 is formed on the surface of the wiring board 10 to surround each circumference of circuit blocks **13*a* to 13*f*. In FIG. 2, for convenience, an electronic component 11 mounted in one circuit block 13*a* is schematically shown, and electronic components mounted in the other circuit blocks 13*b* to 13*f*** are not shown.

As shown in FIG. 3, for example, for each of the blocks **21*a* to 21*f* corresponding to the circuit blocks 13*a* to 13*f* of the wiring board 10, a shield panel 20 formed of conductive metal plate has a convex pattern 22 corresponding to the conductive shield pattern 14 of the wiring board 10, surrounding circumference thereof. The shield panel 20 is bonded to the wiring board 10, and the shield pattern 14 of the wiring board 10 comes into contact with the convex pattern 22 of the shield panel 20. Accordingly, the wiring board 10 is shielded by the shield panel 20 for each circuit block 13**.

As described above, in the related-art inductor built-in wiring board disclosed in JP-A-5-183274 and JP-A-2001-77538, it is possible to form a coil having a desired inductance value on a printed wiring board. However, forming a coil on a printed wiring board, it is difficult to obtain a reasonably satisfactory inductor in light of a pattern forming area, an inductance value, a resonance frequency.

That is, in the inductor built-in wiring board disclosed in JP-A-5-183274 and JP-A-2001-77538, an area occupied by the inductor on the wiring board increases. As a result, a wiring density of the wiring board decreases, or a mounting density of the wiring board including other components decreases.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide an inductor built-in wiring board, in which an inductor is formed using the shield structure shown in FIGS. 2 to 4 and the inductor is pattern-formed on a wiring board. Therefore, a wiring space is effectively used. A pattern forming area decreases in the case of obtaining an inductor by forming a coil on the wiring board. Further, a desired inductance value is obtained, and the board is capable of coping with a high resonance frequency.

According to one or more aspects of exemplary embodiments of the present invention, in a wiring board having a shield function, the wiring board includes:

a plurality of conductive shield patterns adapted to surround a circumference of at least one electronic component mounting area on the wiring board, the plurality of conductive shield patterns being adjacent to each other; and at least one inductor formed of a conductive pattern and provided between the conductive shield patterns.

According to one or more aspects of exemplary embodiments of the present invention, one of the at least one inductor is provided to surround the circumference of the electronic component mounting area, between the adjacent conductive shield patterns.

According to one or more aspects of exemplary embodiments of the present invention, the at least one inductor is provided discontinuously around the circumference of the electronic component mounting area, between the adjacent conductive shield patterns, and end portions of the at least one inductor are electrically coupled to each other via another conductive pattern formed in an inner layer of the wiring substrate, thereby forming a coil.

According to one or more aspects of exemplary embodiments of the present invention, a surface of the inductor is covered with an insulating material.

According to one or more aspects of exemplary embodiments of the present invention, in a wiring board having a shield function, the wiring board includes:

a plurality of conductive shield patterns adapted to surround a circumference of at least one electronic component mounting area on the wiring board, the plurality of conductive shield patterns being adjacent to each other;

at least one inductor formed of a conductive pattern and provided between the conductive shield patterns; and a shield plate at least whose surface is conductive and whose outlines correspond to those of the conductive shield patterns and which has convex patterns coming into contact with the shield patterns.

Other aspects and advantages of the invention will be apparent from the following description, the drawings and the claims.

According to the invention, the wiring board has a shield function by joining the convex patterns of the shield patterns with the conductive shield patterns of the wiring board and thus the inductor formed on the wiring board is shielded. Therefore, it is easy to secure an area for the inductor without generating noises from the inductor to the other electronic components. As a result, it is possible to obtain a large inductance value.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION

Hereinafter, exemplary embodiments of the present invention will be described in detail with reference to the drawings.

Figure 1:
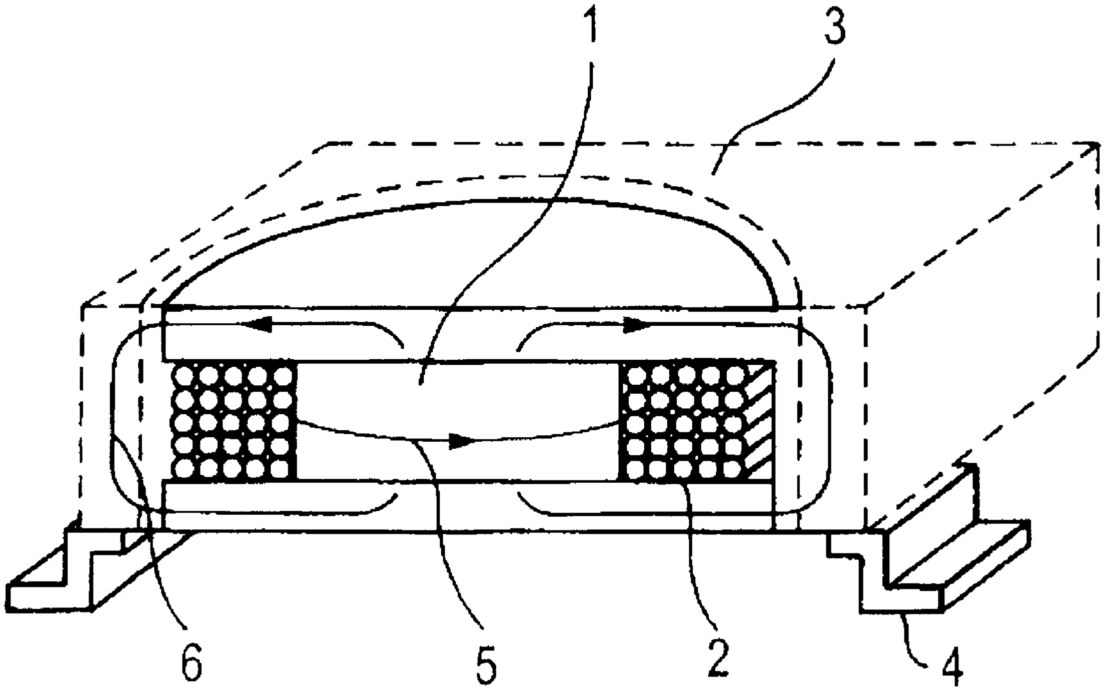
FIG. 1 is a schematic diagram illustrating an inductor mounted on a printed wiring board in the related art.
Figure 2:
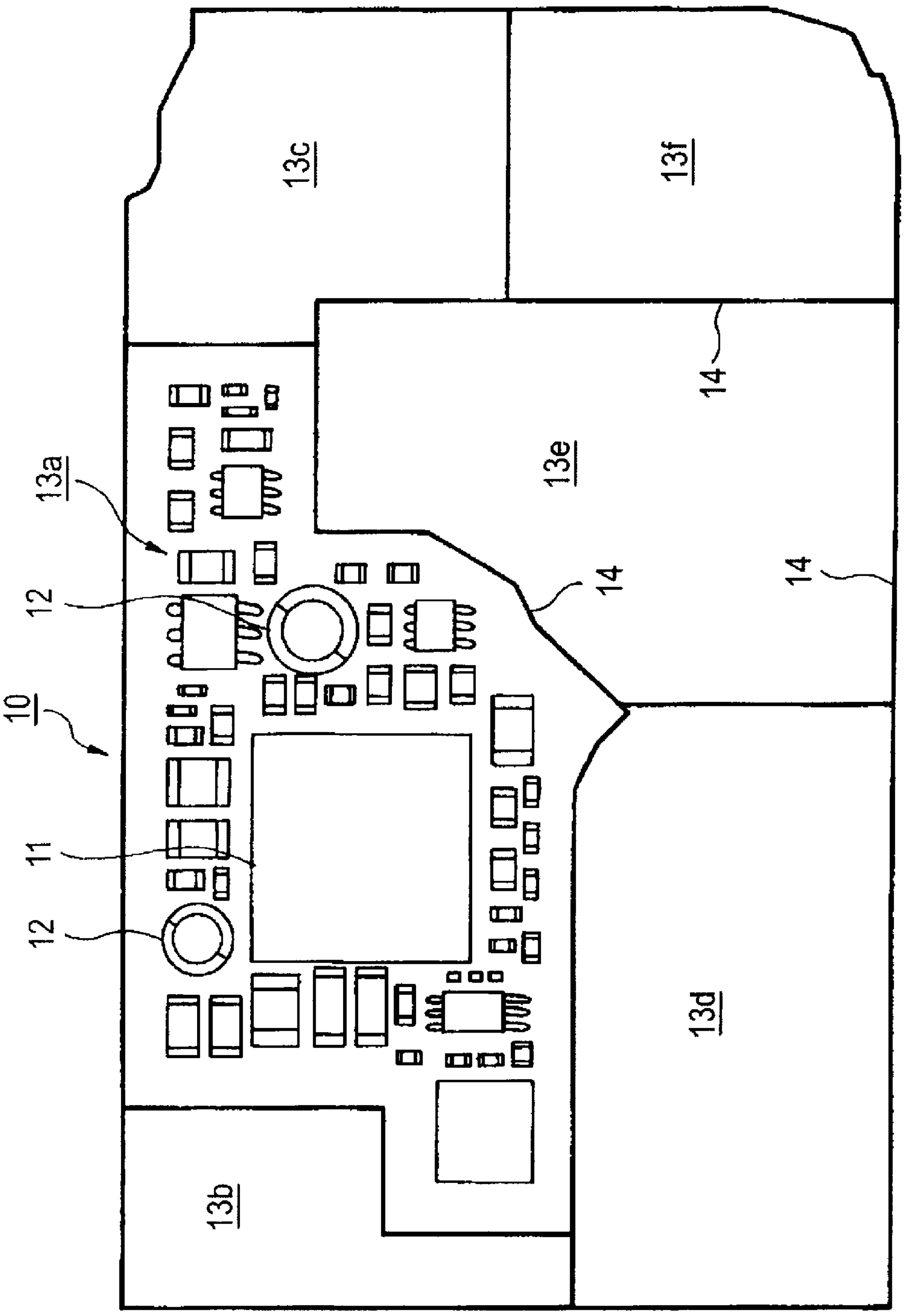
FIG. 2 is a plan view illustrating a wiring board having a shield function in the related art.
Figure 3:
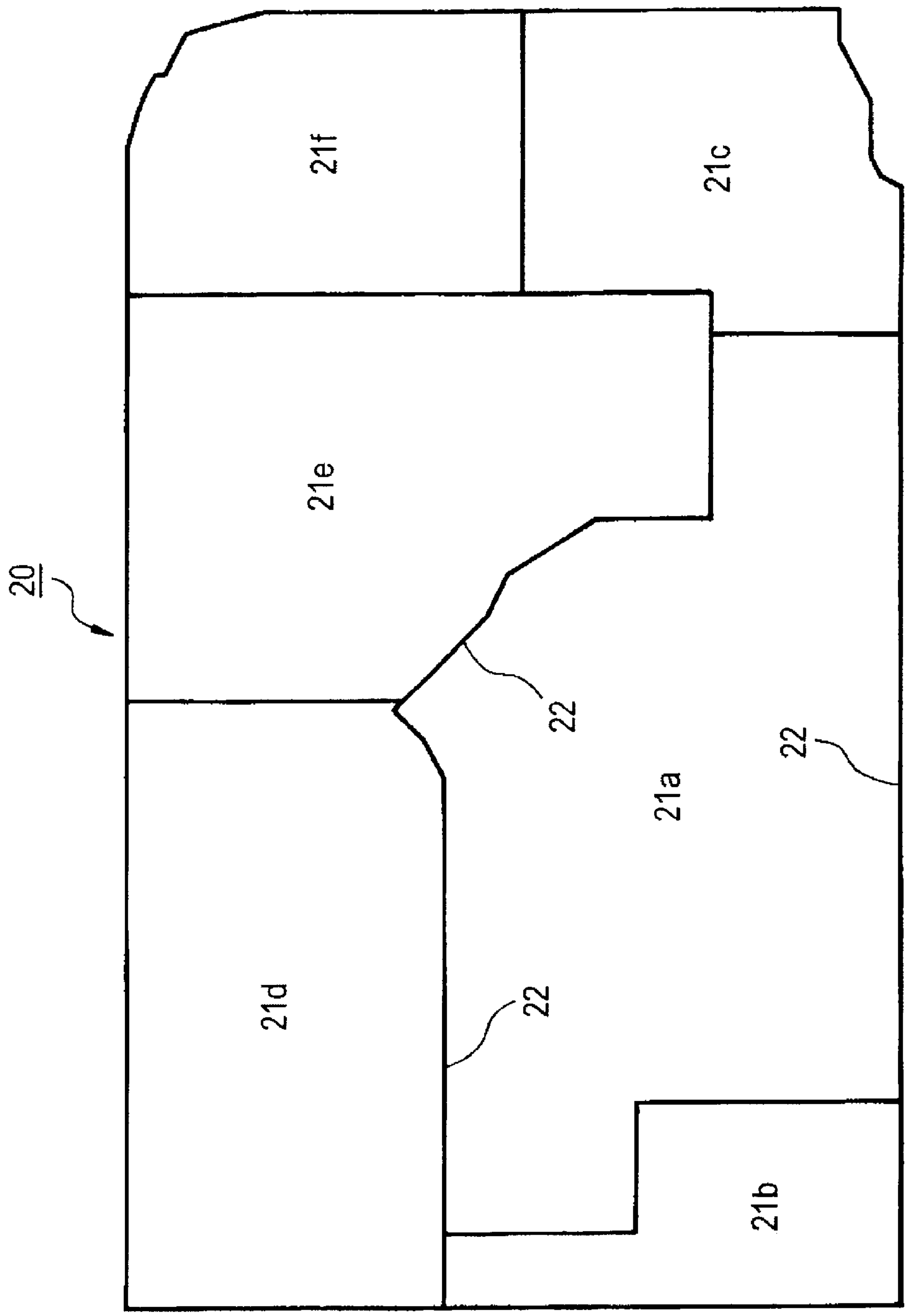
FIG. 3 is a plan view illustrating a shield panel in the related art.
Figure 4:
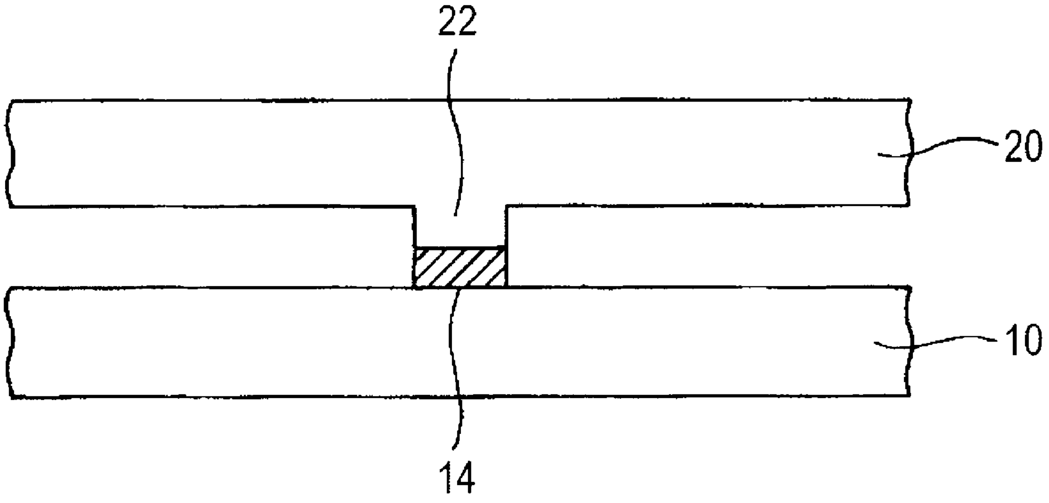
FIG. 4 is a cross-sectional view illustrating a contact portion between a shield panel and a wiring board in the related art.
Figure 5:
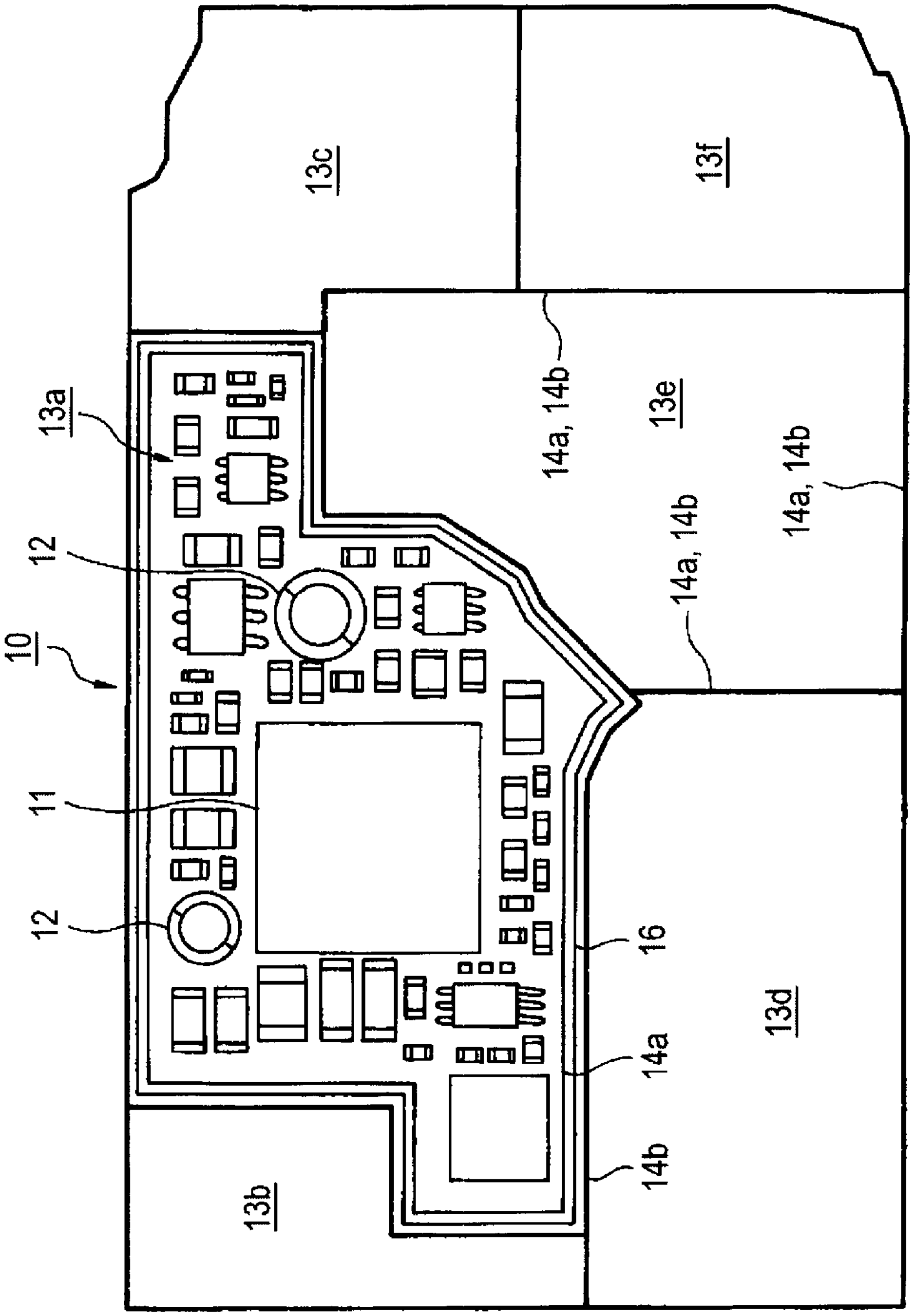
FIG. 5 is a plan view illustrating an inductor built-in wiring board having a shield function according to exemplary embodiments of the present invention.
Figure 6:
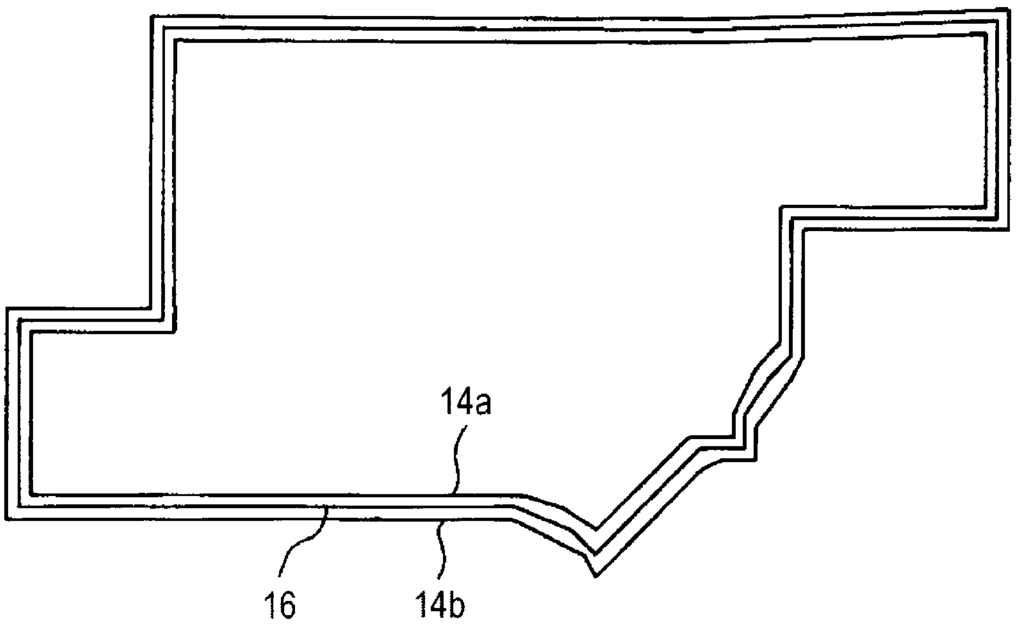
FIG. 6 is a plan view illustrating a shield pattern according to exemplary embodiments of the present invention.

FIG. 5 is a plan view illustrating an inductor built-in wiring board having a shield function according to exemplary embodiments of the present invention. FIG. 6 is a plan view illustrating only shield patterns and a wiring of an inductor.

As shown in FIG. 5, various kinds of electronic components 11 such as semiconductor elements are mounted on a surface of a wiring board 10. These electronic components might include board mounted inductors 12. A plurality of conductive shield patterns 14*a* and 14*b* surround each circumference of circuit blocks 13*a* to 13*f* in which the same block is set as one area, and are formed on the surface of the wiring board 10. In the shown embodiment, two conductive shield patterns are formed adjacent to each other. The inner and outer circumferential two conductive shield patterns 14*a* and 14*b* are continuously formed, for example, around the area 13*a* without discontinuity, and completely cover the same area 13*a* in a frame shape. The two conductive shield patterns 14*a* and 14*b* are formed to form a gap having the same width, so that a conductive pattern 16 constituting an inductor can be disposed therebetween. A width of the conductive pattern 16 might be formed in a range of 100 μm to 1 mm.

In FIG. 5, for convenience, the electronic component 11 mounted only in one circuit block 13*a* is schematically shown, and electronic components mounted in the other circuit blocks 13*b* to 13*f* are not shown. Similarly, although a plurality of conductive shield patterns are continuously formed around the other circuit block 13*b* to 13*f* in a frame shape, herein they are simply shown. In the circuit blocks adjacent to each other, the outer circumferential shield pattern 14*b* of the two conductive shield patterns 14*a* and 14*b* might be shared with each other.

A conductive pattern 16 constitutes an inductor and extends parallel to the shield patterns 14*a* and 14*b*, and is formed in the gap between the two conductive shield patterns 14*a* and 14*b*. In the embodiment shown in FIGS. 5 and 6, the conductive pattern 16 of the inductor is continuously formed all over the circumferential frame of the circuit block 13*a*.

Figure 7:
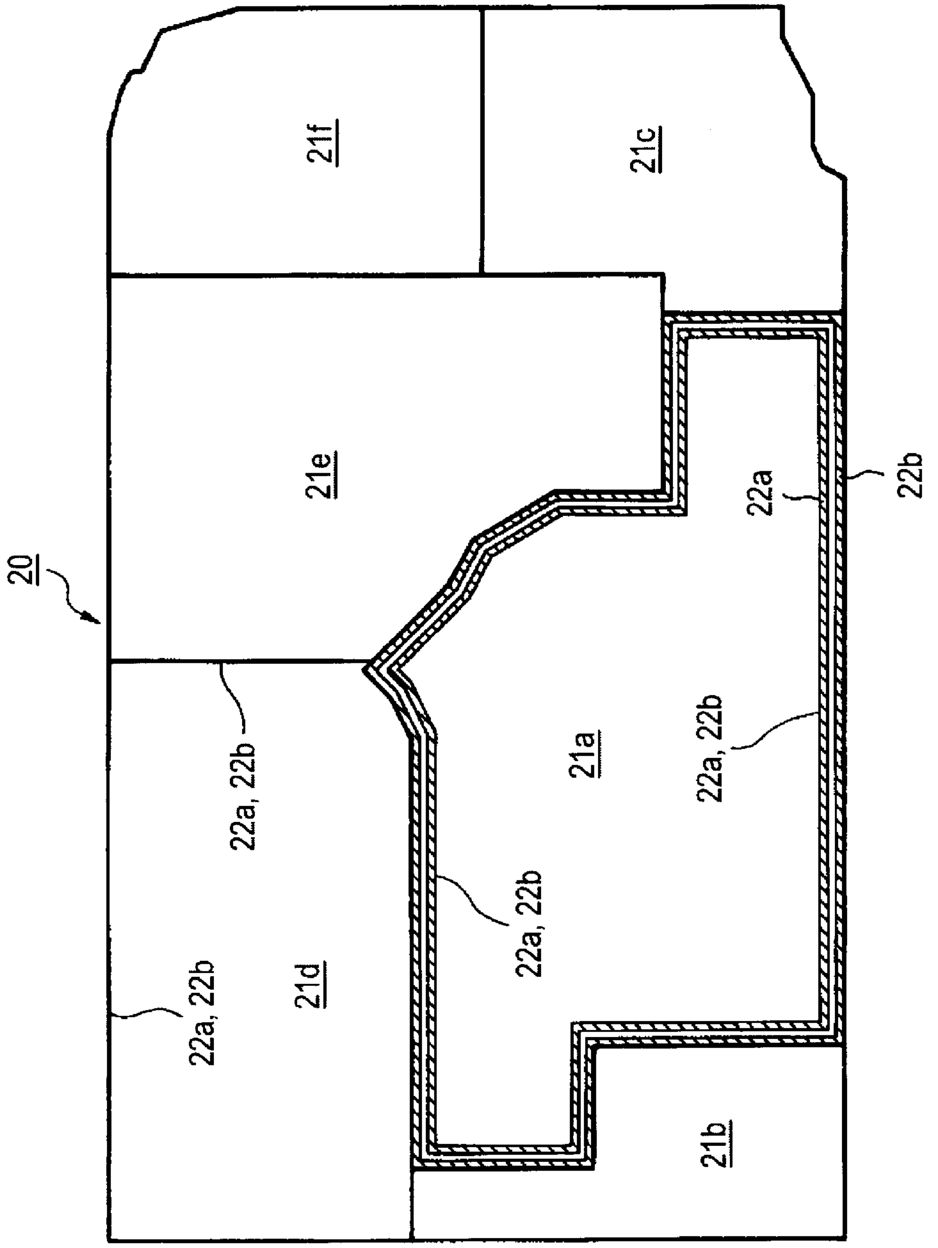
FIG. 7 is a plan view illustrating a shield plate (panel) according to exemplary embodiments of the present invention.

FIG. 7 is a plan view illustrating a shield plate (panel) 20 according to exemplary embodiments of the present invention. The shield panel 20 is formed of, for example, a conductive metal plate or a resin plate whose surface is coated with conductive metal or the like. For example, the shield panel 20 might be formed of a resin plate in which an ABS resin is coated with Ni or alloy of Ni and Co. Also, the ABS resin might be coated with Cr through evaporation method. The shield panel 20 has a plurality of convex patterns. As shown in FIG. 7, in the present embodiment, the shield panel 20 has two convex patterns 22*a* and 22*b* having outlines corresponding to the conductive shield patterns 14*a* and 14*b* of the wiring board 10, which surround each circumference of the blocks 21*a* to 21*f* corresponding to the circuit block 13*a* to 13*f* of the wiring board 10.

In FIG. 7, for convenience, although two convex patterns 22*a* and 22*b* are shown in only area block 21*a* of the shield panel 20 corresponding to the circuit block 13*a*, two convex patterns are similarly formed around the other area blocks 21*b* to 21*f*. In the circuit blocks of the wiring board 10 adjacent to each other, in case of sharing the outer circumferential shield pattern 14*b*, similarly the outer circumferential convex pattern 22*b* of the shield panel 20 is also shared.

Figure 8:
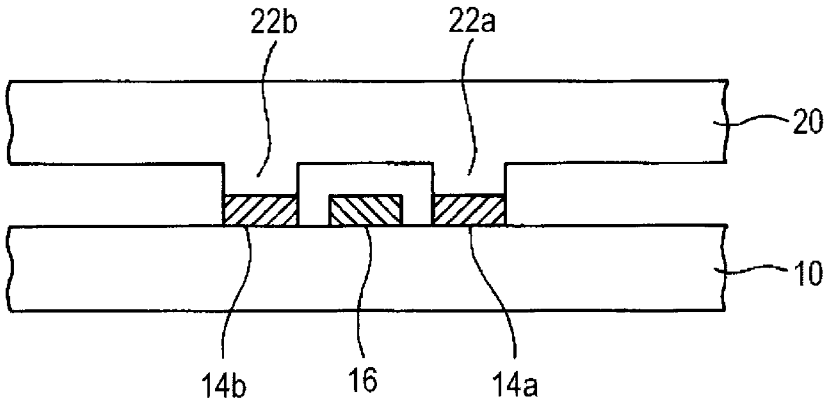
FIG. 8 is a cross-sectional view illustrating a contact portion between a shield panel and a wiring board according to exemplary embodiments of the present invention.
Figure 9:
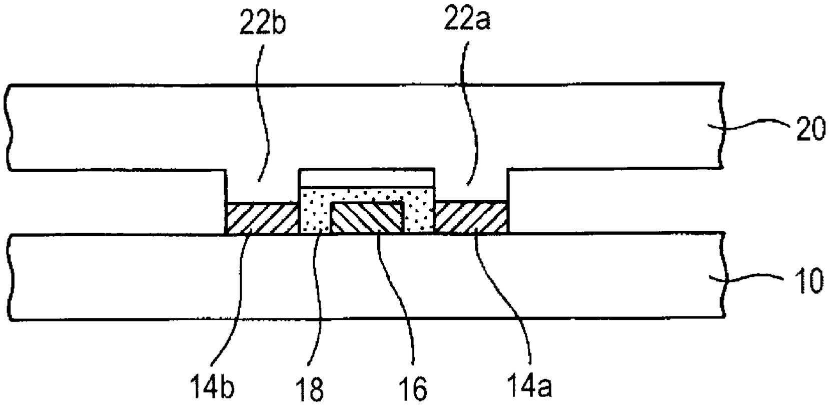
FIG. 9 is a cross-sectional view illustrating another example of a contact portion between a shield panel and a wiring board according to exemplary embodiments of the present invention.

FIGS. 8 and 9 are cross-sectional views illustrating contact portions between the convex patterns 22*a* and 22*b* of the shield panel 20 and the shield patterns 14*a* and 14*b* formed on the wiring board 10, respectively. The shield panel 20 joins with the wiring board 10, so that two shield patterns 14*a* and 14*b* of the wiring board 10 come into contact with two convex patterns 22*a* and 22*b* of the shield panel 20. Accordingly, each of the circuit blocks 13*a* to 13*f* of the wiring board 10 is shielded by the shield panel 20.

In the embodiment shown in FIG. 8, the conductive pattern 16 is exposed from the wiring board 10. However, as the embodiment shown in FIG. 9, the conductive pattern 16 of the inductor might be coated with an insulating material 18 such as solder resist to protect the inductor 16.

Figure 10:
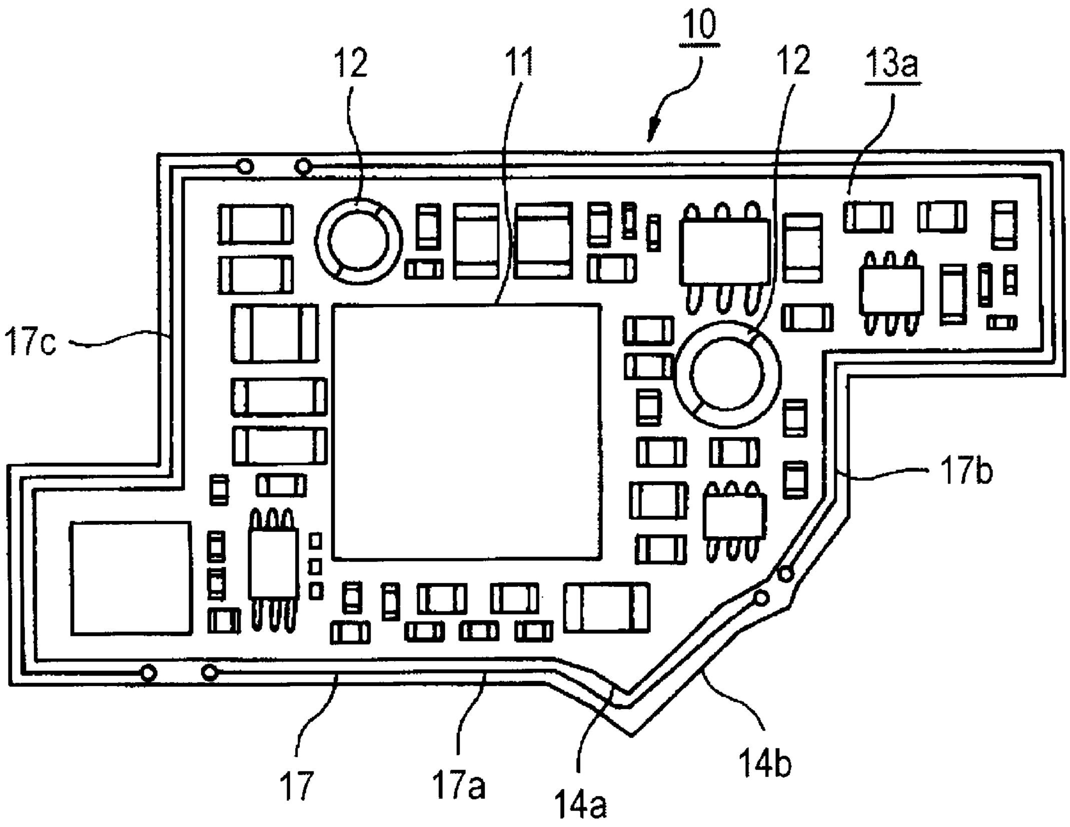
FIG. 10 is a plan view illustrating another example of an inductor built-in wiring board having a shield function according to exemplary embodiments of the present invention.

FIG. 10 is a plan view illustrating an inductor built-in wiring board having a shield function according to another exemplary embodiment of the present invention. In FIG. 10, only one circuit block 13*a* of the wiring board 10 is shown, where various kinds of electronic components such as semiconductor components 11 are mounted, and the other circuit blocks are not shown. The present embodiment is the same as the embodiment shown in FIG. 5 in that two conductive shield patterns 14*a* and 14*b* surround the circumference of each circuit block and are formed adjacent to each other. However, the conductive pattern 17 constituting the inductor formed in the gap between two shield patterns 14*a* and 14*b* is not continuously formed all over the circumferential frame of the circuit block 13*a*, but conductive patterns 17*a* to 17*c* are discontinuously formed on the way. Such discontinuously-formed conductive patterns 17*a* to 17*c* are the same as the embodiment described above in that the patterns 17*a* to 17*c* extend parallel to two shield patterns 14*a* and 14*b* substantially at the center therebetween.

End portions of the conductive patterns 17*a* to 17*c* of each inductor might be coupled to another conductive pattern (not shown) of the inductor formed in another layer, for example, through through-holes or interlayer-vias, thereby forming an appropriate coil While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

For example, in the above-described embodiment, the two shield patterns 14*a* and 14*b* are formed parallel to each other, but three or more shield patterns might be formed substantially parallel to each other, and each of continuous or discontinuous conductive patterns 16 and 17 for an inductor might be formed in the gap between shield patterns adjacent to each other. Moreover, two or more continuous or discontinuous conductive patterns 16 and 17 might be formed in the gap between two shield patterns 14*a* and 14*b*. In addition, appropriate wiring structure might be selectively employed according to the other necessary inductance value and the other factor.

As described above, according to exemplary embodiment of the present invention, a plurality of conductive shield patterns surround circumference of at least one area on a surface of a wiring board in a frame shape, and are formed adjacent to each other. An inductor formed of conductive patterns is formed between the conductive shield patterns. For this reason, the inductor is shielded by joining the convex patterns of the shield plate with the shield patterns of the wiring board, and thus it is easy to secure an area for the inductor without generating noises from the inductor to the other electronic components. As a result, it is possible to obtain a large inductance value. Accordingly, such an inductor formed wiring board having a shield function might be used for a cellular phone, a personal computer, a portable terminal, a PDA, a vehicle control device, a small-size communication machine, and a small-size game machine.

What is claimed is:

1. A wiring board having a shield function, the wiring board comprising:

a pair of conductive shield patterns that surround a plurality of electronic component mounting areas on the wiring board to separate the respective electronic component mounting areas, the pair of conductive shield patterns being arranged parallel to each other; and at least one inductor formed of a conductive pattern and provided on the wiring board between the pair of conductive shield patterns.

2. The wiring board according to claim 1, wherein the at least one inductor is provided to surround the circumference of the electronic component mounting areas.

3. The wiring board according to claim 2, wherein the at least one inductor is provided to completely surround the circumference of the electronic component mounting areas.

4. The wiring board according to claim 1, wherein the at least one inductor is provided to discontinuously surround the circumference of the electronic component mounting areas, and end portions of the at least one inductor are electrically coupled to each other via a conductive pattern formed in the wiring board.

5. The wiring board according to claim 1, wherein a surface of the inductor is covered with an insulating material.

6. The wiring board according to claim 1, wherein the at least one inductor is arranged parallel to the pair of conductive shield patterns on the same surface of the wiring board.

7. The wiring board according to claim 1, wherein the pair of conductive shield patterns completely surround the plurality of electronic component mounting areas on the wiring board.

8. A wiring board having a shield function, the wiring board comprising:

a plurality of conductive shield patterns adapted to surround a circumference of at least one electronic component mounting area on the wiring board, the plurality of conductive shield patterns being adjacent to each other;

at least one inductor formed of a conductive pattern and provided between the conductive shield patterns; and a shield plate at least whose surface is conductive and whose outlines correspond to those of the conductive shield patterns and which has convex patterns coming into contact with the shield patterns.

* * * * *